United States Patent
Ohshita et al.

(10) Patent No.: US 7,416,463 B2
(45) Date of Patent: Aug. 26, 2008

(54) PANEL SUBSTRATE, DISPLAY PANEL, ORGANIC EL PANEL, AND METHOD OF MANUFACTURING THE SAME

(75) Inventors: Isamu Ohshita, Yamagata-ken (JP); Toshinao Yuki, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 428 days.

(21) Appl. No.: 11/045,069

(22) Filed: Jan. 31, 2005

(65) Prior Publication Data

US 2005/0179369 A1 Aug. 18, 2005

(30) Foreign Application Priority Data

Feb. 12, 2004 (JP) ............... 2004-034656
Mar. 17, 2004 (JP) ............... 2004-076087

(51) Int. Cl.
*H01J 9/00* (2006.01)

(52) U.S. Cl. ......................... 445/23; 445/24
(58) Field of Classification Search .............. 445/23–25
See application file for complete search history.

(56) References Cited

U.S. PATENT DOCUMENTS 6,686,692 B1 * 2/2004 Tanaka et al. ............... 313/504

FOREIGN PATENT DOCUMENTS

JP 11-191487 7/1999
JP 2001176660 A * 6/2001

* cited by examiner

*Primary Examiner*—Joseph L Williams
(74) *Attorney, Agent, or Firm*—Arent Fox LLP.

(57) ABSTRACT

A panel substrate which has an improved surface flatness so as to prevent a reduced display performance of a display panel. The panel substrate of the invention comprises a substrate member, a polish processing layer formed through wet film formation on or above the substrate member, and a polished surface formed as the surface of the polish processing layer.

2 Claims, 5 Drawing Sheets

FIG.1

PRIOR ART

PANEL SUBSTRATE, DISPLAY PANEL, ORGANIC EL PANEL, AND METHOD OF MANUFACTURING THE SAME

BACKGROUND OF THE INVENTION

The present invention relates to a panel substrate, a display panel, an organic EL (Electroluminescence) panel, and a method of manufacturing the organic EL panel.

The present application claims priority from Japanese Applications Nos. 2004-76087, 2004-34656, the disclosures of which are incorporated herein by reference.

A flat display panel is usually formed by mounting at least one display (element) device on a panel substrate, and it has been pointed out that a flatness of the surface of such a panel substrate greatly affects the displaying performance of the display panel. Especially, with regard to an organic EL panel, if there are irregularities on the surface of a panel substrate, an un-uniformity will occur in the thickness of each of several layers laminated on the panel substrate, resulting in a deteriorated displaying performance.

Figure 1:
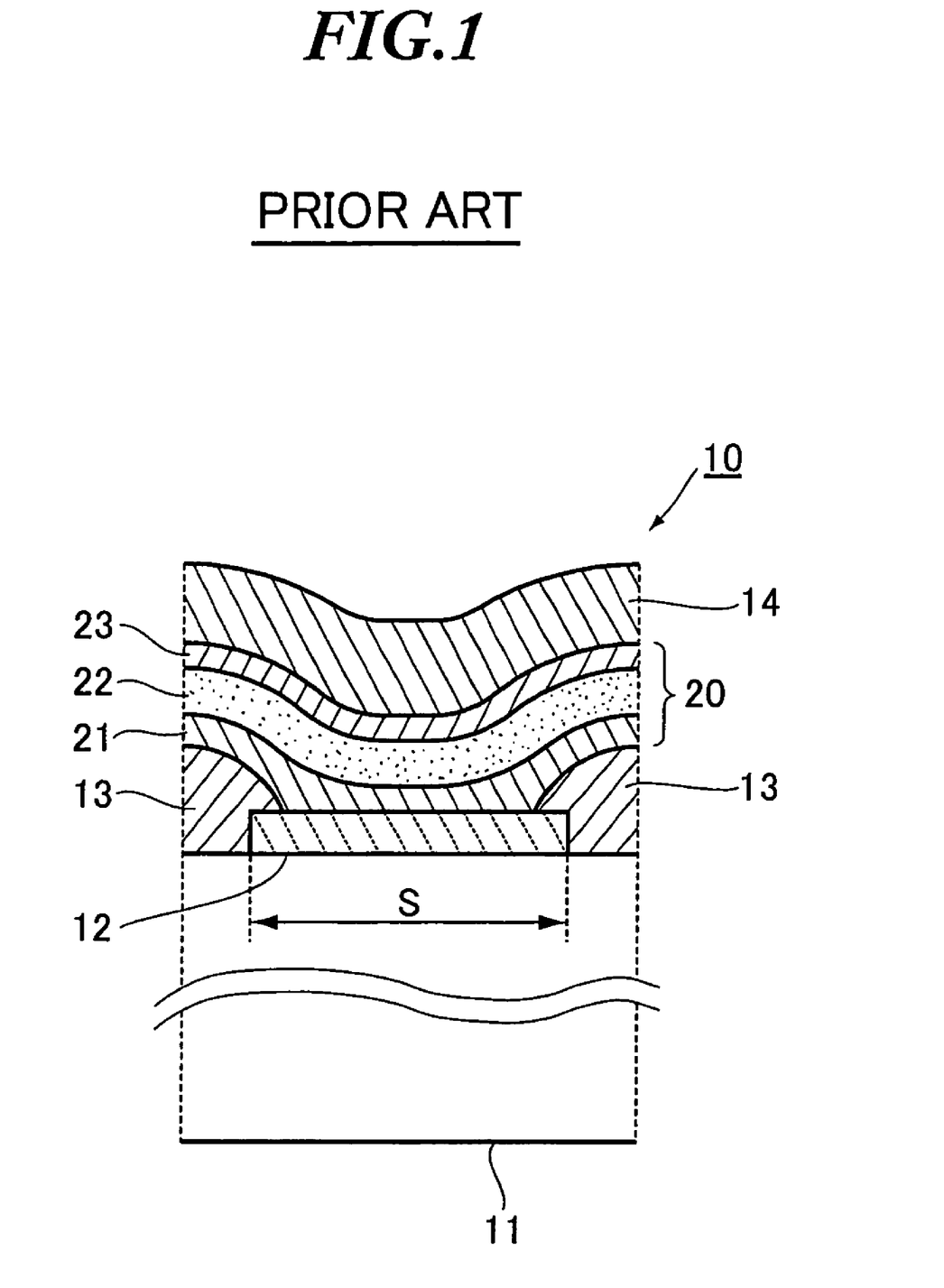
FIG. 1 is an explanatory view showing the structure of a conventional display panel.

FIG. 1 is a sectional view showing the cross section of an organic EL (element) device 10 for use in forming a conventional organic EL panel. As shown, the organic EL device 10 mounted on a panel substrate 11 has a laminated structure formed by interposing an organic layer 20 containing at least one organic luminescence layer between a pair of electrodes. Further, insulating films 13 are formed around a lower electrode 12 on the panel substrate 11, while an area on the lower electrode 12 surrounded by the insulating film 13 forms a luminescent area S. Moreover, in the luminescent area S, the organic layer 20 is laminated on the lower electrode 12, while an upper electrode 14 is formed on the organic layer 20.

As one example, the organic layer 20 has a three-layer structure including a hole transporting layer 21, a luminescent layer 22, and an electron transporting layer 23, with the lower electrode 12 serving as an anode and the upper electrode 14 as a cathode. However, it is also possible to form a structure not including the hole transporting layer 21 and/or the electron transporting layer 23, or a structure in which at least one of the aforementioned layers is formed into a multi-layered structure. Alternatively, it is also possible to form a hole injection layer on the anode side of the hole transporting layer 21, and an electron injection layer on the cathode side of the electron transporting layer 23. In addition, it is further possible for the lower electrode 12 to be used as a cathode and the upper electrode 14 as an anode.

Such an organic EL device for use in forming an organic EL panel, once under an electric voltage applied between the lower electrode 12 and the upper electrode 14, allows positive holes to be injected and transported from the anode side to the organic layer 20, and electrons to be injected and transported from the cathode side to the organic layer 20, thereby effecting a light emission through a recombination of the positive-holes with electrons. On such an occasion, although an electric current flows between the anode and the cathode due to the recombination of positive holes with electrons, if there are some surface irregularities on the surface of the panel substrate 11 within the luminescent area S, such surface irregularities will also occur on the surface of the lower electrode 12 mounted on the panel substrate 11. As a result, some thin portions will locally occur in the organic layer 20 within the luminescent area S. Once such thin portions locally occur, a leak current (different from the current caused by the aforementioned recombination) will be generated there, causing some problems such as an emission failure and an increased power consumption.

In order to solve the above problem, Japanese Unexamined Patent Application Publication No. 11-191487 suggests that the surface flatness of a panel substrate can be improved if the surface thereof is polished chemically or mechanically prior to forming an organic EL device on the panel substrate.

With regard to the aforementioned conventional polishing method for treating the surface of a panel substrate, although it is possible to easily shave convexities on such surface, it is impossible to eliminate some scratches-like deep concavities without cutting a thick portion from the surface of the panel substrate. Actually, since the depths of such concavities are unrecognizable, it is difficult to completely eliminate such concavities on the panel substrate surface.

Usually, two kinds of glass substrates have been utilized as a panel substrate for a flat panel display, one is called "soda lime glass" if containing an alkaline component, and the other "non alkaline glass" if not containing an alkaline component. When utilizing a panel substrate containing an inexpensive alkaline component, a commonly used method is to coat the surface of the panel substrate with an $SiO_2$ film through sputtering, thereby preventing an undesired effect of the alkaline component of the panel substrate on the above-mentioned display (element) device.

However, with regard to the aforementioned panel substrate surface on which the concavities are still remaining, even if the $SiO_2$ film has been formed through sputtering, it is still impossible for a sputtering process to provide a thick film because of the necessity of film-stress control, hence making it impossible to fill the concavities on the panel substrate surface. In addition, since pin-holes of the $SiO_2$ film will be formed in these concavities, it is impossible to block an invasion of the alkaline component of the panel substrate even if the $SiO_2$ film has been formed.

SUMMARY OF THE INVENTION

The present invention has been accomplished to solve the above-discussed problems. Namely, it is an object of the present invention to increase a surface flatness for a panel substrate and thus avoid a reduced displaying performance of a display panel. In particular, the present invention is to provide an improved organic EL panel by preventing a leak current, thereby eliminating some problems such as an emission failure and an increased electricity consumption. A further object of the present invention is to ensure a high flatness on the surface of a panel substrate even if there are some scratches-like deep concavities, as well as to ensure an exact function of blocking an alkaline component even if utilizing an inexpensive glass substrate containing an alkaline component.

In order to achieve the above objects, the present invention is constituted by at least the following aspects.

According to one aspect of the present invention, there is provided a panel substrate comprising: a substrate member; at least one polish processing layer formed on or above the substrate member; and a polished surface formed as the surface of the polish processing layer.

According to another aspect of the present invention, there is provided an organic EL panel having a panel substrate and an organic EL device formed on the panel substrate, such organic EL device including a pair of electrodes and at least one organic luminescence layer interposed between the pair of electrodes. Here, the panel substrate comprises: a substrate member; at least one polish processing layer formed on or above the substrate member; and a polished surface formed as the surface of the polish processing layer. The organic EL device is formed on the polished surface.

According to a further aspect of the present invention, there is provided a method of manufacturing an organic EL panel having a panel substrate and an organic EL device formed on the panel substrate, such organic EL device including a pair of electrodes and an organic luminescence layer interposed between the pair of electrodes. The method comprises: a step of forming at least one polish processing layer on or above a substrate member; a step of polishing the surface of the polish processing layer to form a flat polished surface thereon, thereby forming the panel substrate; and a step of forming the organic EL device on the panel substrate.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

In the following, an embodiment of the present invention will be described with reference to the accompanying drawings. (However, the same elements as those used in the above-described prior art will be represented by the same reference numerals, with the same and repeated descriptions omitted.)

Figure 2:
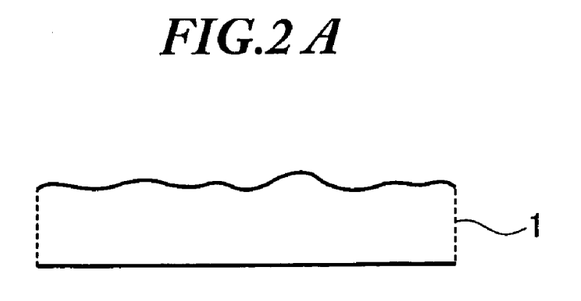
FIGS. 2A to 2C are explanatory views showing a process of forming a panel substrate and its structure according to one embodiment of the present invention.

FIGS. 2A to 2C are explanatory views showing a process of forming a panel substrate and the structure of the formed panel substrate, in accordance with one embodiment of the present invention. As shown, in forming the panel substrate, a substrate member 1 is prepared at first. Then, a polish processing layer 2 is formed on or above the top surface of the substrate member 1, using a dry film formation method such as vapor deposition and sputtering, or a wet film formation method such as dip coating, spin coating, and application coating (shown in FIG. 2B). However, it is also possible to form the polish processing layer 2 on the top surface of a processed substrate member 1 as is, or it is allowed to at first polish the surface of the processed substrate member 1 and then form the polish processing layer 2 on the polished surface. Besides, it is further possible to at first form a thin film having other functions on the substrate member 1, followed by forming the polish processing layer 2 on the thin film. On the other hand, if necessary, it is allowed to use both of the above-mentioned dry and wet film formation methods.

Figure 3A:
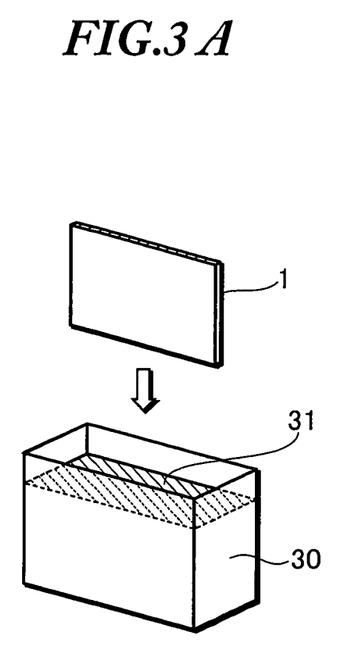
FIGS. 3A to 3B are explanatory views showing a dip coating process which is one of wet film formation methods.
Figure 3B:
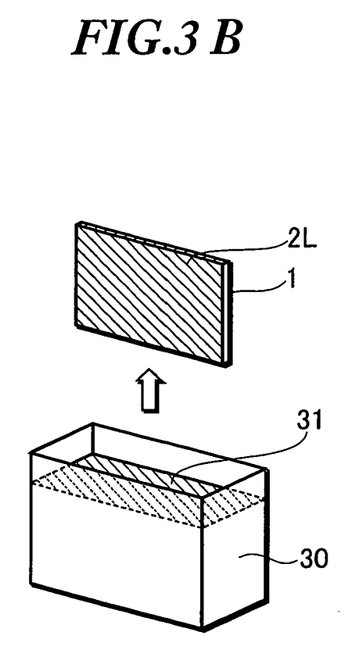

Next, description will be given to explain a commonly used process for dip coating (which is one of wet film formation methods), with reference to FIGS. 3A to 3C. As shown in FIG. 3A, the substrate member 1 is vertically dipped into a coating liquid (serving as a material for forming the polish processing layer 2) stored in a tank 30. Then, as shown in FIG. 3B, the substrate member 1 covered by a coating liquid layer 2L is pulled out of the tank 30. Subsequently, the coating liquid layer covering one surface of the substrate member 1 is removed, while the substrate member itself with the other surface thereof being covered by the coating liquid layer is exposed to the air and baked under a predetermined condition, thereby forming the polish processing layer 2 having a predetermined thickness on this surface of the substrate member 1 shown in FIG. 2B.

Afterwards, the surface of the polish processing layer 2 thus formed is polished to form a flat polished surface 2A (shown in FIG. 2C). At this time, it is allowed to employ a known polishing method (using a known polishing apparatus) shown in FIG. 4. In detail, the substrate member 1 is caught by a substrate carrier 41 by being clamped at one surface thereof opposite to a surface having the polish processing layer 2, while a polishing block 40 is forced to press against the polish processing layer 2 of the substrate member 1. Subsequently, the substrate carrier 41 and the polishing block 40 are rotated in mutually opposite directions so as to polish the surface of the polish processing layer 2. At this time, if necessary, it is also possible to add a polishing agent between the polish processing layer 2 and the polishing block 40. The present invention is not limited to the above-described polishing method, but can employ any other known polishing methods.

Thus, the panel substrate formed according to the present embodiment of the present invention comprises the substrate member 1, the polish processing layer 2 formed by a wet method on or above the top surface of the substrate member 1, and the polished surface 2A formed on the surface of the polish processing layer 2. In this way, even if some deep concavities exist on the surface of the substrate member 1, forming the polish processing layer 2 by a wet method will enable the polish processing layer 2 to have an adequate thickness to fill the concavities. Subsequently, once the polished surface 2A is formed, it is possible to produce a desired panel substrate having a high surface flatness. However, the present invention also allows to polish the surface of the substrate member 1 prior to forming the polish processing layer 2. Alternatively, the process of forming the polish processing layer may be performed several times after forming the flat polished surface 2A.

Figure 5:
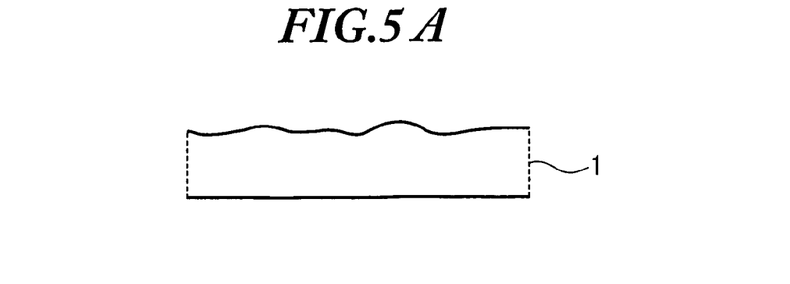
FIGS. 5A to 5D are explanatory views showing a dip coating process.

Moreover, as shown in FIG. 5, it is also possible to perform a polishing process after the polish processing layer 2 has been formed through several times of film formation. At this time, for example, the substrate member 1 may be prepared in the same manner as in the above-described embodiment (FIG. 5A), followed by performing several times of wet film formation (described above) on or above the top surface of the substrate member 1.

Here, as shown in FIG. 5B, during a first time film formation in which a polish processing layer 2a is formed on or above the top surface of the substrate member 1, there is a possibility that a film formation defect $P_1$ will locally occur in film layer because of an adhesion of an alien matter to the surface of the substrate during the film formation process. In order to avoid concavities caused by such film formation defect $P_1$ which remains even if a polished surface is formed thereon, a second film formation as well as subsequent film formations will be performed using a wet method and are performed prior to forming the polished surface, thereby forming a polish processing layer 2b capable of filling the film formation defect $P_1$ (FIG. 5C). At this time, in order to completely fill the film formation defect $P_1$, what is necessary is only to form the polish processing layer 2b at a predetermined thickness t2 which is thicker than a predetermined thickness t1 of the polish processing layer 2a (t2>t1). Indeed, there is a possibility that a film formation defect $P_2$ may similarly occur during the process of forming the polish processing layer 2b.

However, it is usually impossible for later film formation defects $P_2$ (occurred during a second and later film formations) to overlap the film formation defect $P_1$ occurred during the first film formation, thereby making it possible to exactly fill the film formation defect $P_1$ through the second and later film formations.

Then, the surfaces of the polish processing layers 2a and 2b formed during several film formations are polished so as to form a flat polished surface 2A (FIG. 5D). At this time, a polishing thickness t3 should be at least larger than the thickness t2 which is a total thickness of films formed during the second and later film formations (t3>t2). In this way, it is possible to form the desired flat polished surface 2A irrespective of whether or not there is the film formation defect $P_1$.

Moreover, by forming the polish processing layer 2 on the substrate member 1 at a thickness capable of filling the concavities on the surface of the substrate member 1, it is possible for the entire polished surface 2A of the polish processing layer 2 to be formed into a uniform surface. Therefore, it is allowed to ensure a uniform function for the display (element) device formed on the polished surface 2A. Furthermore, since an entire surface of the substrate member 1 will be completely covered by the polish processing layer 2, even if the substrate member 1 contains some undesired components (an alkali component and the like) harmful to display (element) device, such components can be prevented from invading into the display (element) device, thereby enabling the display (element) device formed on the polished surface 2A to provide an acceptable quality.

In addition, if the polish processing layer 2 is formed through a wet film formation, it is possible to quickly form a uniform coating without any blank. Furthermore, since an internal stress can be reduced at the time of film formation, it is possible to inhibit a film cracking caused by a film distortion, thereby resulting in a relatively thick film layer.

Moreover, by using the substrate member 1 as a glass substrate and using an $SiO_2$ or TiN film to form the polish processing layer 2, it is possible to obtain a transparent panel substrate having a high flatness. Further, even in a case where an inexpensive alkali-containing glass ("blue plate") is used, since it is possible to completely prevent the precipitation of alkali components, it is allowed to produce a high quality transparent panel substrate at a low cost.

Besides, using a display panel equipped with the above-described panel substrate, it is possible to avoid a poor display performance which would otherwise be caused by the irregularities on the surface of a panel substrate, thus making it possible to produce a display panel having a high quality and a high yield.

Next, description will be given to explain an organic EL panel adopting the above-described panel substrate. However, such description should not form any limitation to a display panel formed according to the above-described embodiment of the present invention. In fact, the present invention covers all display panels each containing as its essential element a panel substrate having an adequate surface flatness.

Figure 6:
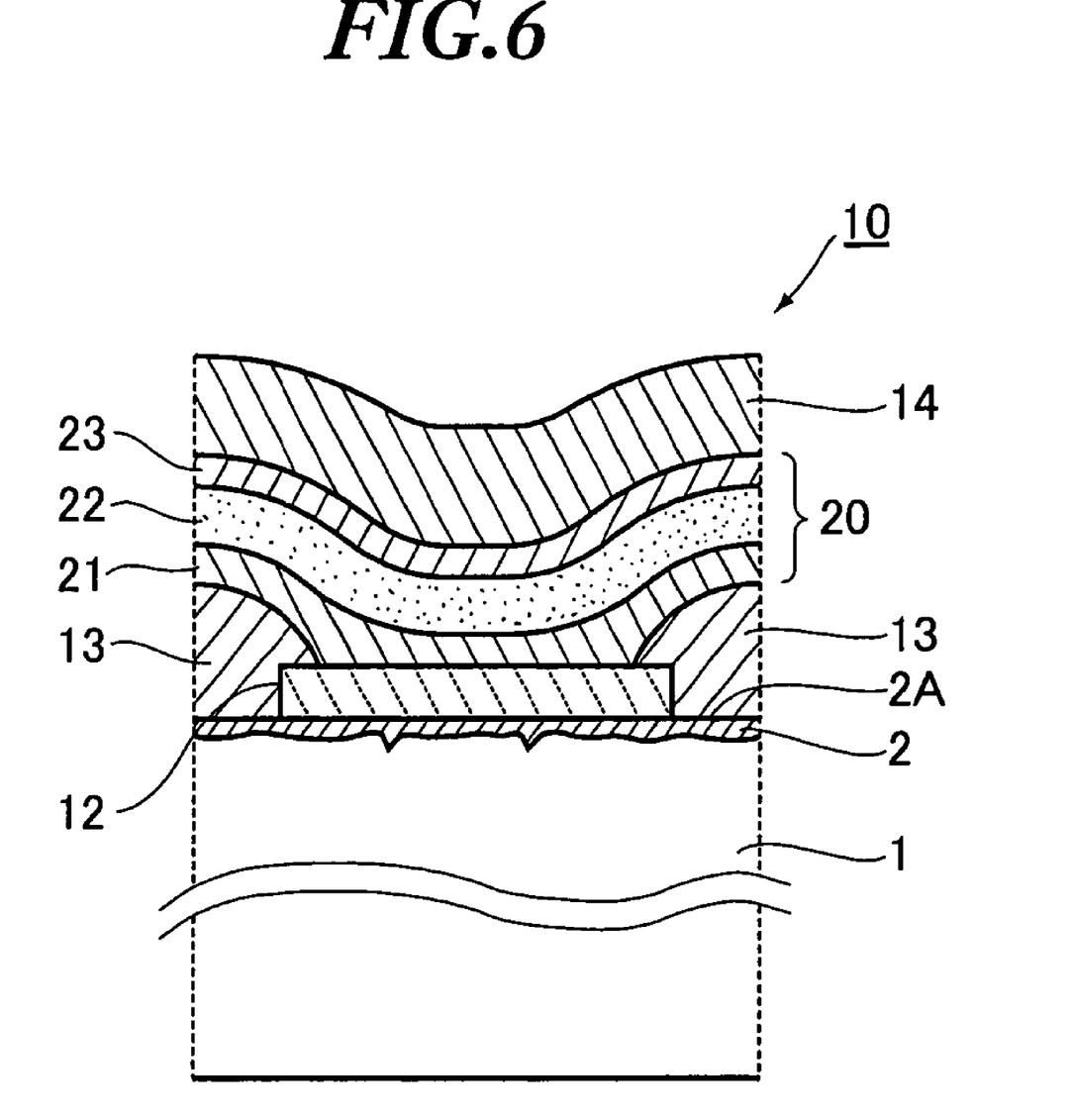
FIG. 6 is an explanatory view showing the structure of an organic EL device for use in forming an organic EL panel according to an embodiment of the present invention.

FIG. 6 is an explanatory view showing an organic EL (element) device 10 for use in forming an organic EL panel according to an embodiment of the present invention. As shown, the organic EL device 10 is almost the same as the above-described conventional one (shown in FIG. 1) except its panel substrate. Namely, the organic EL device 10 of the present invention has a laminated structure formed by interposing an organic layer 20 comprising organic luminescence layers (including a hole transporting layer 21, a luminescent layer 22, an electron transporting layer 23, and the like) between a pair of electrodes (a lower electrode 12 and an upper electrode 14). Such an organic EL device 10 is formed on the polished surface 2A of the panel substrate.

Next, description will be given to explain a method of manufacturing an organic EL panel. At first, a panel substrate is formed by a first step of forming a polish processing layer 2 on a substrate member 1 using a wet film formation method including a dip-coating, and a second step of polishing the surface of the polish processing layer 2 to form a flat polished surface 2A. Subsequently, the lower electrode 12 is formed on the polished surface 2A of the panel substrate and surrounded by insulating films 13. Afterwards, the hole transporting layer 21, the luminescent layer 22, and the electron transporting layer 23 are successively laminated on the lower electrode 12 so as to form the organic layer 20. Finally, the upper electrode 14 is formed over the organic layer 20.

In this way, since the lower electrode 12 is formed on the polished surface 2A having a high flatness, it is possible for the lower electrode 12 to have the similar high flatness, thereby allowing the organic layer 20 laminated on the lower electrode 12 to have a uniform thickness, thus ensuring a uniform layer thickness between the upper electrode 14 and the lower electrode 12.

As a result, there will not be any thin portion locally formed in the organic layer 20 in the luminescent area, making it sure to exactly prevent a leak current possibly caused by such local thin portion. Consequently, it is allowed to avoid a light emission failure and an increased electricity consumption caused by the leak current, thereby obtaining an organic EL panel having a high quality and a high yield.

Next, description will be given to explain in detail various essential elements forming the organic EL panel according to the present invention.

a. Substrate Member

The panel substrate member 1 can be formed by glass, plastic, quartz, metal, or the like. If a display panel is a bottom emission type emitting light from the substrate member 1 side, it is preferable for the substrate member 1 to be formed into a transparent flat plate or a film-like plate made of glass or plastic. Since the polish processing layer 2 is formed on the surface of the panel substrate member 1 according to the present invention, selecting an appropriate material for forming the polish processing layer 2 makes it possible to increase the variety of materials suitable for forming the substrate member 1.

b. Electrodes

One of the lower electrode 12 and the upper electrode 14 is set as a cathode, while the other of them is set as an anode. The anode is formed by a material having a higher work function than the cathode, using a transparent conductive film which may be a metal film such as chromium (Cr), molybdenum (Mo), nickel (nickel), and platinum (Pt), or a metal oxide film such as ITO and IZO. In contrast, the cathode is formed by a material having a lower work function than the anode, using a metal having a low work function, which may be an alkali metal (such as Li, Na, K, Rb, and Cs), an alkaline earth metal (such as Be, Mg, Ca, Sr, and Ba), a rare earth metal, a compound or an alloy containing two or more of the above elements, or an amorphous semiconductor such as a doped polyaniline and a doped polyphenylene vinylene, or an oxide such as $Cr_2O_3$, NiO, and $Mn_2O_5$. Moreover, when the lower electrode 12 and the upper electrode 14 are all formed by transparent materials, it is allowed to provide a reflection film on one electrode side opposite to the light emission side.

c. Organic Layer

Although the organic layer 20 comprises one or more layers of organic compound materials including at least one organic luminescence layer, its laminated structure can be in any desired arrangement. Usually, as shown in FIG. 1, there is a laminated structure including, from the anode towards the cathode, a hole transporting layer 21, a luminescent layer 22, and an electron transporting layer 23. Each of the hole transporting layer 21, the luminescent layer 22, and the electron transporting layer 23 can be in a single-layer or a multi-layered structure. Moreover, it is also possible to dispense with the hole transporting layer 21 and/or the electron transporting layer 23. On the other hand, if necessary, it is allowed to insert other organic layers including a hole injection layer and an electron injection layer. Here, the hole transporting layer 21, the luminescent layer 22, and the electron transporting layer 23 can be formed by any conventional materials (it is allowed to use either a high molecular material or a low molecular material).

With regard to a luminescent material for forming the luminescent layer 22, it is allowed to use a luminescence (fluorescence) when the material returns from a singlet excited state to a base state or a luminescence (phosphorescence) when it returns from a triplet excited state to a base state.

d. Covering Member, Covering Film

Further, an organic EL panel according to the present invention is a panel formed by covering an organic EL device 10 with a covering member made of metal, glass, or plastic, or a panel formed by covering an organic EL device 10 with a covering film.

Here, the covering member may be a piece of material having a recess portion (a one-step recess or a two-step recess) formed by pressing, etching, or blasting. Alternatively, the covering member may be formed by using a flat glass plate and includes an internal covering space to be formed between the flat glass plate and the support substrate by virtue of a spacer made of glass (or plastic).

The covering film can be formed by laminating a single layer of protection film or a plurality of protection films, and is allowed to be formed by either an inorganic material or an organic material. Here, an inorganic material may be a nitride such as SiN, AlN, and GaN, or an oxide such as SiO, $Al_2O_3$, $Ta_2O_5$, ZnO, and GeO, or an oxidized nitride such as SiON, or a carbonized nitride such as SiCN, or a metal fluorine compound, or a metal film, etc. On the other hand, an organic material may be an epoxy resin, or an acryl resin, or a paraxylene resin, or a fluorine system high molecule such as perfluoro olefin and perfluoro ether, or a metal alkoxide such as $CH_3OM$ and $C_2H_5OM$, or a polyimide precursor, or a perylene system compound, etc. In practice, the above-mentioned lamination and material selection can be carried out by appropriately designing an organic EL device.

e. Various Types of Display Panels.

An organic EL panel of the present invention can be a passive matrix type display panel or an active matrix type display panel. Although such a display panel may be a single color display or a multi-color display, forming a color display panel needs to adopt a discriminated painting method or a method in which a single color (white or blue) organic EL panel is combined with a color conversion layer formed by a color filter or a fluorescent material (CF manner, CCM manner), thereby making it possible to form a full color organic EL panel or a multi-color organic EL panel. Further, an organic EL panel of the present invention can be a bottom emission type allowing light emission from the panel substrate side, or a top emission type allowing light emission from an opposite side away from the panel substrate side.

EXAMPLES

Examples of the above-described organic EL panel and the method of manufacturing the same will be described in detail below with reference to the accompanying drawings (reference numerals are the same as those shown in FIGS. 2 to 6).

Example 1

A substrate member 1 consisting of a glass substrate is at first dipped in $SiO_2$ coating liquid 31 stored in a tank 30, then gradually lifted up from the tank 30. Subsequently, a coating liquid layer 2L on the surface of the glass substrate is hydrolyzed, followed by drying and burning the same, thereby forming $SiO_2$ film (i.e., polish processing layer 2) having a thickness of 50 to 200 nm (preferably 80 nm).

Figure 4:
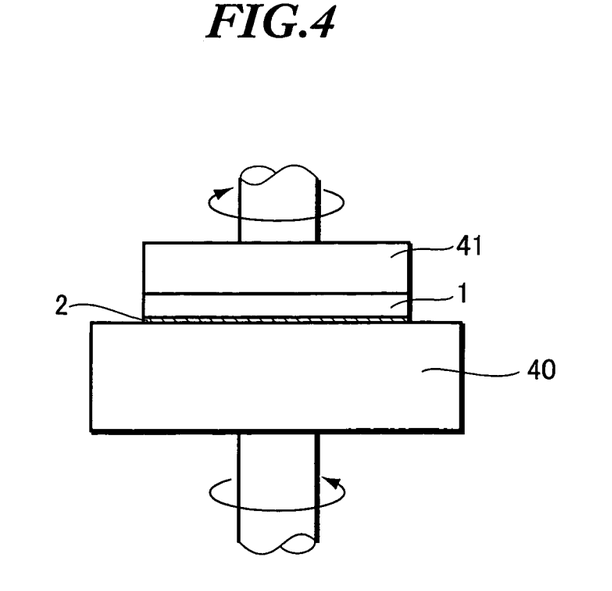
FIG. 4 is an explanatory view showing a polishing method or a polishing device.

Afterwards, alumina powder, diamond powder or the like is utilized as a polishing agent to polish the polish processing layer 2 until its thickness becomes 20 to 100 nm, using a polishing device shown in FIG. 4, thereby forming a polished surface 2A on the top of the panel substrate.

Subsequently, an ITO film of 150 nm serving as the lower electrode 12 is formed on the polished surface 2A by virtue of sputtering, followed by forming a stripe-like resist pattern on the ITO film. Next, the treated panel substrate is dipped in a mixed solution of ferric chloride solution and hydrochloric acid, to etch portions of the ITO film uncovered by the resist layer, followed by dipping the panel substrate in acetone so as to remove the resist layer, thereby producing a panel substrate having a predetermined ITO pattern.

Then, the panel substrate carrying the ITO film is moved into a vacuum deposition apparatus to vapor-deposit an organic layer 20 on the ITO film serving as the lower electrode 12. Actually, the organic layer 20 is formed by a hole injecting layer consisting of copper phthalocyanine, a hole transporting layer consisting of TDP or the like, a luminescent layer or electron transporting layer consisting of $Alq_3$ or the like, an electron injecting layer consisting of LiF, etc. Subsequently, an upper electrode 14 consisting of Al or the like and serving as a cathode is laminated on the organic layer 20.

Next, a one-step recess portion is formed on a flat glass plate by performing etching on the flat glass plate. Then, a sheet-like desiccant containing BaO as its main component is attached into the one-step recess portion, thereby forming a covering member. Subsequently, one surface of the substrate 11 on which an organic EL device 10 has been formed, and one surface of the covering member on which the recess portion has been formed, are bonded together in a manner such that an internal space is formed therebetween, thereby forming an organic EL panel. When the bonding is to be carried out, plastic spacers having a particle size of 100 μm are mixed at a ratio of 0.1-0.5 weight % into an amount of ultraviolet-setting epoxy resin adhesive so as to form an adhesive agent. Such an adhesive agent is applied to a bonding area of either the substrate 11 or the covering member using a dispenser or the like to bond together the substrate 11 and the covering member, followed by irradiating the adhesive agent with ultraviolet light so as to harden such an adhesive agent.

Example 2

A substrate member 1 consisting of a glass substrate is at first dipped in $SiO_2$ coating liquid 31 stored in a tank 30, then gradually lifted up from the tank 30. Subsequently, the coating liquid layer on the surface of the glass substrate is hydrolyzed, followed by drying and burning the same, thereby forming $SiO_2$ film (a polish processing layer 2a) having a thickness of 140 nm. Subsequently, another polish processing layer 2b having a thickness of 170 nm is formed thereon in the same manner as the polish processing layer 2a.

Afterwards, alumina powder, diamond powder or the like is utilized as a polishing agent to polish the polish processing layer (the polish processing layer 2a+the polish processing layer 2b) by 200 nm, using a polishing device, thereby forming the polish processing layer 2 having a thickness of 110 nm with a polished surface 2A on the surface of the panel substrate.

Subsequently, an ITO film of 150 nm serving as the lower electrode 12 is formed on the polished surface 2A by virtue of sputtering, followed by forming a stripe-like resist pattern on the ITO film. Next, the treated panel substrate is dipped in a mixed solution of ferric chloride solution and hydrochloric acid, to etch portions of the ITO film uncovered by the resist layer, followed by dipping the panel substrate in acetone so as to remove the resist layer, thereby obtaining a panel substrate having a predetermined ITO pattern.

Then, the panel substrate carrying the ITO film is moved into a vacuum deposition apparatus to vapor-deposit an organic layer 20 on the ITO film serving as the lower electrode 12. Actually, the organic layer 20 is formed by a hole injecting layer consisting of copper phthalocyanine, a hole transporting layer consisting of TDP or the like, a luminescent layer or electron transporting layer consisting of $Alq_3$ or the like, an electron injecting layer consisting of LiF, etc. Subsequently, an upper electrode 14 consisting of Al or the like and serving as a cathode is laminated on the organic layer 20.

Next, a one-step recess portion is formed on a flat glass plate by performing etching on the flat glass plate. Then, a sheet-like desiccant containing BaO as its main component is attached into the one-step recess portion, thereby forming a covering member. Subsequently, one surface of the substrate 11 on which an organic EL device 10 has been formed, and one surface of the covering member on which the recess portion has been formed, are bonded together in a manner such that an internal space is formed therebetween, thereby forming an organic EL panel. When the bonding process is to be carried out, plastic spacers having a particle size of 1 to 100 μm are mixed at a ratio of 0.1 to 0.5 weight % into an amount of ultraviolet-setting epoxy resin adhesive so as to form an adhesive agent. Such an adhesive agent is applied to a bonding area of either the substrate 11 or the covering member using a dispenser or the like to bond together the substrate 11 and the covering member, followed by irradiating the adhesive agent with ultraviolet light so as to harden such an adhesive agent.

Since the above-described display panel of the present invention has the above-described structure, it is possible to obtain the following advantages.

(1) It is possible to avoid the generation of a leak current by improving the flatness of the panel substrate surface, thereby preventing a light emission failure as well as an increased power consumption of an organic EL display panel which is otherwise caused due to the leak current.

(2) It is possible to take all glass substrates as non-defective products, even if scratches have appeared due to transportation, movement to factories, and some other mechanical factors, thereby improving yield.

(3) When carrying out a wet film formation based on a dip-coating method or the like, it is easy to form a thick $SiO_2$ film (polish processing layer), thereby making it possible to easily adjust a polishing amount during a subsequent polishing step. In this way, by adjusting the thickness of the panel substrate, it is possible to set a peak wavelength of an outgoing light wavelength in accordance with a light spectral obtained from the luminescent layer, thereby making it easy to carry out an optical designing for an organic EL panel.

(4) It is possible to flatten the surface of a glass substrate which is for use in forming an organic EL panel, irrespective of whether the glass substrate is a non alkaline glass or a soda lime glass. Further, since it is possible to avoid the precipitation of an alkaline component from a blue board, it is allowed to produce a high quality panel substrate using a cheap substrate member.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of manufacturing an organic EL panel having a panel substrate and an organic EL device formed on the panel substrate, said organic EL device including a lower electrode and an upper electrode and at least one organic luminescence layer interposed between the lower electrode and the upper electrode, said method comprising the steps of:

forming at least one polish processing layer on or above a substrate member using a wet film formation method;

polishing the surface of the polish processing layer to form a flat polished surface thereon, thereby forming the panel substrate; and forming the organic EL device on the panel substrates, wherein the lower electrode is formed on the polished surface of the panel substrate and surrounded by insulating films;

wherein said organic luminescent layer is laminated on the lower electrode and the upper electrode is laminated on the organic luminescent layer.

2. The method according to claim 1, wherein the step of forming the polish processing layer includes several times of film formation, the total film thickness obtained from the second and later film formations is set to be larger than a film thickness obtained from the first time film formation, wherein the thickness of polishing away the polish processing layer is set to be at least larger than the total film thickness obtained in the second and later film formations.

* * * * *